United States Patent
Ueda et al.

(10) Patent No.: US 6,610,583 B2
(45) Date of Patent: Aug. 26, 2003

(54) METHOD FOR MANUFACTURING SEMICONDUCTOR THIN FILM, AND MAGNETOELECTRIC CONVERSION ELEMENT PROVIDED WITH SEMICONDUCTOR THIN FILM THEREBY MANUFACTURED

(75) Inventors: Masaya Ueda, Matto (JP); Tomoharu Sato, Kanazawa (JP); Masanaga Nishikawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/886,775

(22) Filed: Jun. 21, 2001

(65) Prior Publication Data

US 2002/0016048 A1 Feb. 7, 2002

(30) Foreign Application Priority Data

Jun. 22, 2000 (JP) ........................................ 2000-188220

(51) Int. Cl.⁷ .......................... H01L 21/20; H01L 21/36
(52) U.S. Cl. ........................................ 438/483; 438/694
(58) Field of Search ............................ 117/89, 95, 105; 438/48, 478, 481, 483, 488, 496, 502, 689, 694, 761, 763, 771, 776, 974

(56) References Cited

U.S. PATENT DOCUMENTS 5,605,860 A  *  2/1997  Kawasaki et al. ............ 438/48

6,224,713 B1  *  5/2001  Hembree et al. ............ 156/345

FOREIGN PATENT DOCUMENTS

JP  7-249577  9/1995

OTHER PUBLICATIONS

Bunshah, "Deposition Technologies for Films and Coatings," Chapter 4, p. 102, Noyes Publications, New York, 1982.*

* cited by examiner

Primary Examiner—Kamand Cuneo
Assistant Examiner—Asok Kumar Sarkar
(74) Attorney, Agent, or Firm—Keating & Bennett, LLP (57) ABSTRACT

A method for manufacturing a semiconductor thin film having high carrier mobility, and a magnetoelectric conversion element provided with the semiconductor thin film manufactured by the aforementioned method are provided. The temperature of the Si single crystal substrate is raised to 270° C. to 320° C., and an In buffer layer is formed by an electron beam heating type vacuum evaporation method. Subsequently, an initial seed layer made of Sb and In is formed. The temperature of the Si single crystal substrate is raised to 460° C. to 480° C., and thereafter, a retention time approximated by a predetermined function of the temperature of the Si single crystal substrate is provided. Then, a main growth layer made of Sb and In is formed.

8 Claims, 5 Drawing Sheets

METHOD FOR MANUFACTURING SEMICONDUCTOR THIN FILM, AND MAGNETOELECTRIC CONVERSION ELEMENT PROVIDED WITH SEMICONDUCTOR THIN FILM THEREBY MANUFACTURED

BACKGROUND OF THE INVENTION

1. Field of the Invention

The present invention relates to a method for manufacturing a semiconductor thin film, in particular, an indium antimonide thin film, and relates to a magnetoelectric conversion element provided with the semiconductor thin film manufactured by the aforementioned method.

2. Description of the Related Art

Hitherto, an indium antimonide, that is, InSb, compound semiconductor having high carrier mobility has been used as a material for magnetoelectric conversion elements, such as a magnetic resistance element and a hall element. Among those, for example, an InSb magnetic resistance element was made of an InSb single crystal bulk flake being adhered to a support substrate, and thereafter, being polished so as to be an element, although there was a problem of poor reliability at a high temperature. This was because of an occurrence of degradation in the adhesion force at a high temperature, an occurrence of peeling and cracks due to differences in thermal expansion coefficients among InSb, an adhesion layer, and a support substrate, etc. Therefore, in recent years, many attempts were made to directly grow semiconductor thin films of III–V compounds, such as InSb, on Si substrates, and an InSb thin film having good quality was produced as disclosed in Japanese Unexamined Patent Application Publication No. 7-249577. Since the InSb thin film having high quality was directly formed on the Si substrate so as to be an element, this film was a potential magnetic resistance material for high temperature uses, such as car electronics.

When the InSb thin film was grown on the Si substrate in accordance with the method disclosed in Japanese Unexamined Patent Application Publication No. 7-249577, however, the carrier mobility was about 42,000 cm$^2$/V·s or less, and was not sufficient for the desired sensitivity of the magnetic resistance element.

SUMMARY OF THE INVENTION

Accordingly, it is an object of the present invention to provide a method for manufacturing a semiconductor thin film having high carrier mobility. It is another object of the present invention to provide an electronic component, such as magnetoelectric conversion element, provided with the semiconductor thin film manufactured by the aforementioned method.

In order to achieve the aforementioned objects, a method for manufacturing a semiconductor thin film according to an aspect of the present invention is composed of the steps of removing a surface oxide film from a substrate having a surface made of a silicon single crystal hydrogen, terminating the surface of the substrate, forming a buffer layer made of indium on the substrate, forming an initial seed layer made of indium and antimony on the buffer layer, and forming a main growth layer made of indium and antimony on the initial seed layer while a temperature of the aforementioned substrate is kept at 460° C. to 480° C.

The step of removing the surface oxide film from the substrate having the surface made of the silicon single crystal and the step of hydrogen terminating the surface of the substrate are preferably performed at the same time with a treatment using an aqueous solution selected from the group consisting of an aqueous solution of hydrogen fluoride, an aqueous solution of ammonium fluoride, and a mixed aqueous solution thereof. Furthermore, in the formation of the main growth layer, it is preferable to raise a temperature of the substrate having the surface made of the silicon single crystal to 460° C. to 480° C., and to form the main growth layer after a retention time approximated by a function of the temperature of the substrate is provided.

According to the aforementioned method, the semiconductor thin film having high carrier mobility can be produced. More specifically, when the temperature T (° C.) of the substrate having the surface made of the silicon single crystal is in the range of 460 to 480 (° C.), and the retention time τ (min) satisfies the relationship represented by the formula $-0.02T^2+17.3T-3703 < \tau < -0.02T^2+17.3T-3691$, a carrier mobility of 45,000 cm$^2$/V·s to 52,000 cm$^2$/V·s can be stably exhibited.

The method for manufacturing the semiconductor thin film according to the present invention is preferably further composed of the step of forming the main growth layer at a relatively low growth velocity so as to have a predetermined layer thickness, and the step of successively forming the main growth layer at a relatively high growth velocity. More specifically, it is preferable that the main growth layer is formed at a low growth velocity of 0.01 to 0.5 nm/s until the film thickness reaches 5 to 100 nm, and the main growth layer is successively formed at a high growth velocity of 0.2 to 5 nm/s.

According to the aforementioned method, in the process of forming the main growth layer, the crystallization property of InSb is improved by controlling the supply velocity of In and Sb at a low level in the initial stage of the main growth layer. After the layer thickness reaches the predetermined value, the InSb thin film can be successively formed at increased supply velocities of both materials without degradation of the crystallization property.

The step of removing the surface oxide film from the substrate having the surface made of the silicon single crystal and the step of hydrogen terminating the surface of the substrate are preferably performed with a treatment using an aqueous solution selected from the group consisting of an aqueous solution of hydrogen fluoride, an aqueous solution of ammonium fluoride, and a mixed aqueous solution thereof while the surface of the substrate is continuously exposed to the aforementioned aqueous solution in an activated state, so that all over the surface of the aforementioned substrate is uniformly hydrogen terminated.

In the formation of the buffer layer, the initial seed layer, and the main growth layer, it is preferable to heat and vaporize indium by an electron beam heating type vacuum evaporation method, and to deposit vaporized indium on the substrate having the surface made of the silicon single crystal.

Regarding an electronic component, such as magnetoelectric conversion element, according to another aspect of the present invention, the component includes a semiconductor thin film formed by the method of manufacture having the aforementioned features, and further includes at least one of a short circuit electrode, a terminal electrode, and a protection film, so that the component has sufficient reliability at a high temperature and has superior electrical properties.

Other features and advantages of the present invention will become apparent from the following description of the invention which refers to the accompanying drawings.

DETAILED DESCRIPTION OF THE PREFERRED EMBODIMENTS

Preferred embodiments of the method for manufacturing the semiconductor thin film and of the magnetoelectric conversion element provided with the semiconductor thin film manufactured by the aforementioned method according to the present invention are explained below with reference to the drawings.

First, the surface of a Si single crystal substrate is hydrogen terminated (hereafter referred to as HF termination) using an aqueous solution of hydrogen fluoride (HF). Specifically, the Si single crystal substrate is subjected to an organic cleaning, an acid cleaning, an alkali cleaning, and an ultrasonic cleaning. Subsequently, the Si single crystal substrate is immersed in a 5% aqueous solution of hydrogen fluoride while at a standstill for 1 minute, and then is washed in ultrapure water. An oxide film on the surface of the Si single crystal substrate is thereby removed with etching, and thereafter, exposed dangling bonds of Si are bonded with hydrogen (Si—H bond) so as to be hydrogen terminated. The resulting surface of the Si single crystal substrate subjected to the HF termination treatment has an effect of preventing natural oxidation. In order to stabilize the quality in the manufacture process, however, the Si single crystal substrate is preferably set in the vacuum evaporation apparatus within 30 minutes after completion of the HF termination treatment. The Si single crystal substrate has an n-type (111) surface, a thickness of 200 to 500 mm, and a resistivity of 1 kW·cm or more. A hydrogen termination effect similar to the aforementioned effect can be produced using the aqueous solution of ammonium fluoride ($NH_4F$) or a mixed aqueous solution of an aqueous solution of hydrogen fluoride and an aqueous solution of ammonium fluoride.

Figure 1:
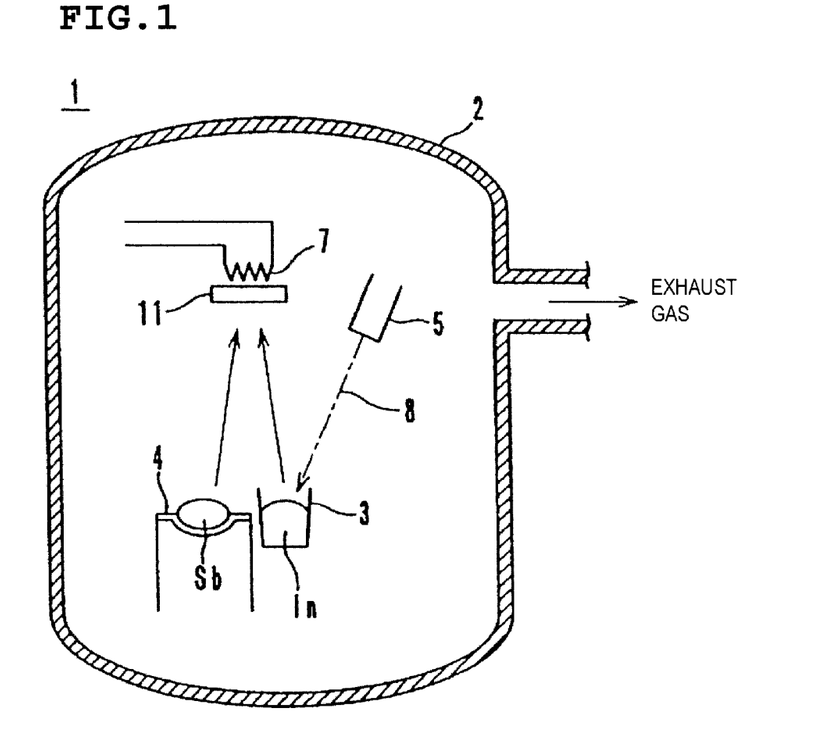
FIG. 1 is a schematic structural diagram of a vacuum evaporation apparatus used in a method for manufacturing a semiconductor thin film according to the present invention.

FIG. 1 is a schematic structural diagram of a vacuum evaporation apparatus 1. A crucible 3 containing In, an evaporation boat 4 containing Sb, an electron beam gun for heating the In, and a heater 7 for heating a Si single crystal substrate 11 are contained in a vacuum chamber 2.

Figure 2:
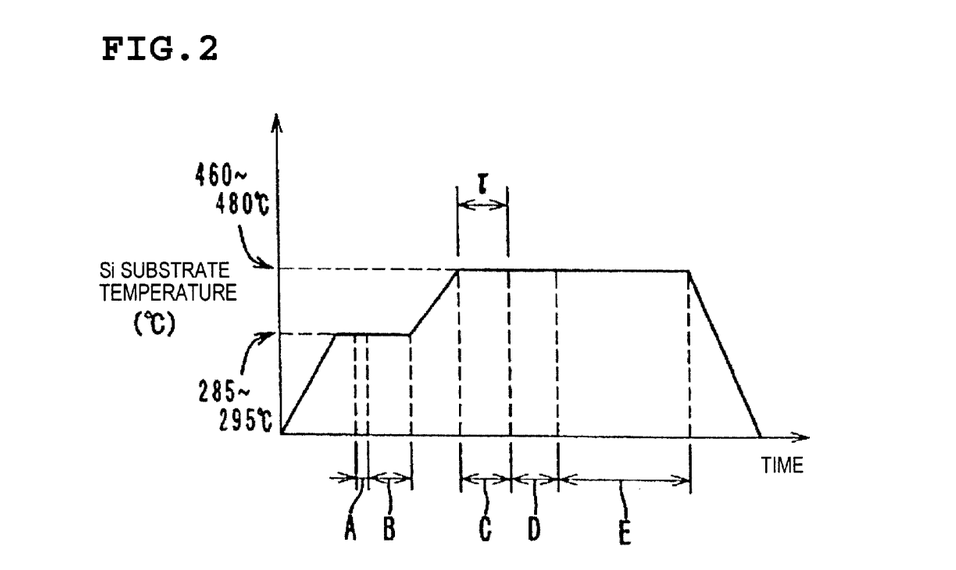
FIG. 2 is a time chart diagram regarding a Si substrate temperature in a method for manufacturing a semiconductor thin film according to an embodiment of the present invention.

The Si single crystal substrate 11 subjected to the HF termination treatment is set in the vacuum evaporation apparatus 1, and thereafter, the vacuum chamber 2 is exhausted until the degree of vacuum reaches $1\times10^{-3}$ Pa or less. Then, as shown in FIG. 2, the temperature of the Si single crystal substrate 11 is raised to 270° C. to 320° C. by heating with the heater 7. In contained in the crucible 3 is heated by the electron beam 8 irradiated from the electron beam gun 5, so that an In buffer layer is formed on the surface of the Si single crystal substrate 11 by an electron beam heating type vacuum evaporation method as is indicated by A in FIG. 2, which is a step of forming the In buffer layer. The thickness of the resulting In buffer layer is 0.2 to 1.0 nm.

Subsequently, the whole of the evaporation boat 4 is heated by a current being passed through the evaporation boat 4, so that Sb contained in the evaporation boat 4 is heated, and an initial seed layer made of Sb by the boat heating type vacuum evaporation method and In by the electron beam heating type vacuum evaporation method is formed on the surface of the In buffer layer as is indicated by B in FIG. 2, which is a step of forming the initial seed layer. The thickness of the resulting initial seed layer is 2 to 200 nm. At this time, a supply ratio of Sb relative to In, that is, Sb/In, is 1.2 to 3.0. The crystallization property of the resulting InSb initial seed layer has a significant effect on the quality of the InSb thin film, and is affected by the temperature of the Si single crystal substrate, the thickness of the In buffer layer, the supply ratio In/Sb, and the thickness of the initial seed layer. As the method for vapor depositing Sb, a resistance heating type vacuum evaporation method, in which a crucible is heated with a heater, may be adopted.

Figure 3:
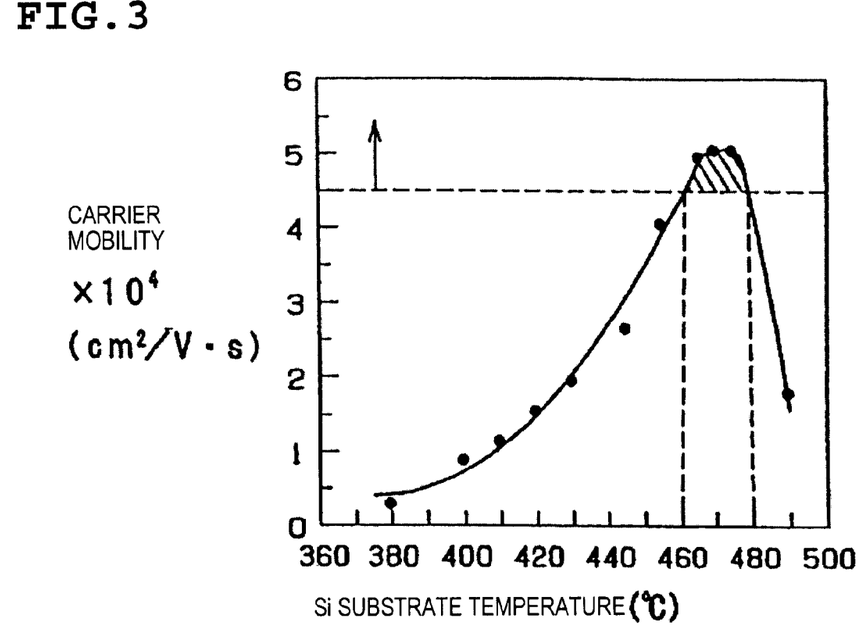
FIG. 3 is a graph showing the relationship between the Si substrate temperature and the carrier mobility.

Next, a step of forming a main growth layer is performed. Herein, it was discovered that the temperature of the Si single crystal substrate 11 during the formation of the main growth layer and the carrier mobility of the manufactured InSb thin film had the relationship shown in FIG. 3. That is, the carrier mobility of the InSb thin film increases exponentially with increasing temperature of the Si single crystal substrate 11, so that the carrier mobility exceeds 45,000 $cm^2/V \cdot s$ at 460° C. or more. When the temperature of the Si single crystal substrate 11 is further raised exceeding 480° C., however, the carrier mobility is decreased to less than 45,000 $cm^2/V \cdot s$.

Figure 4:
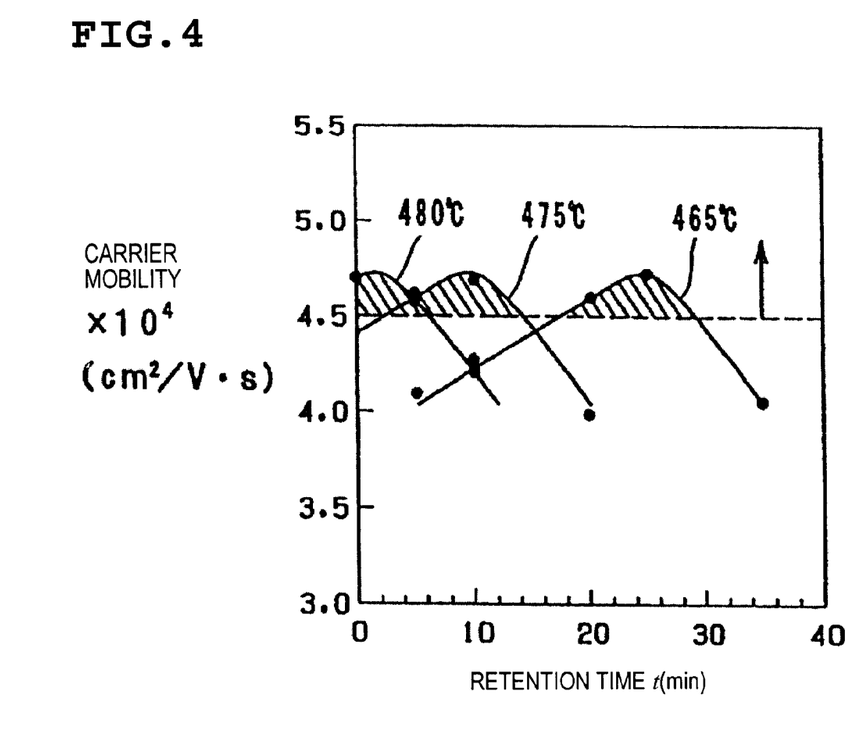
FIG. 4 is a graph showing the relationship between the retention time and the carrier mobility.
Figure 5:
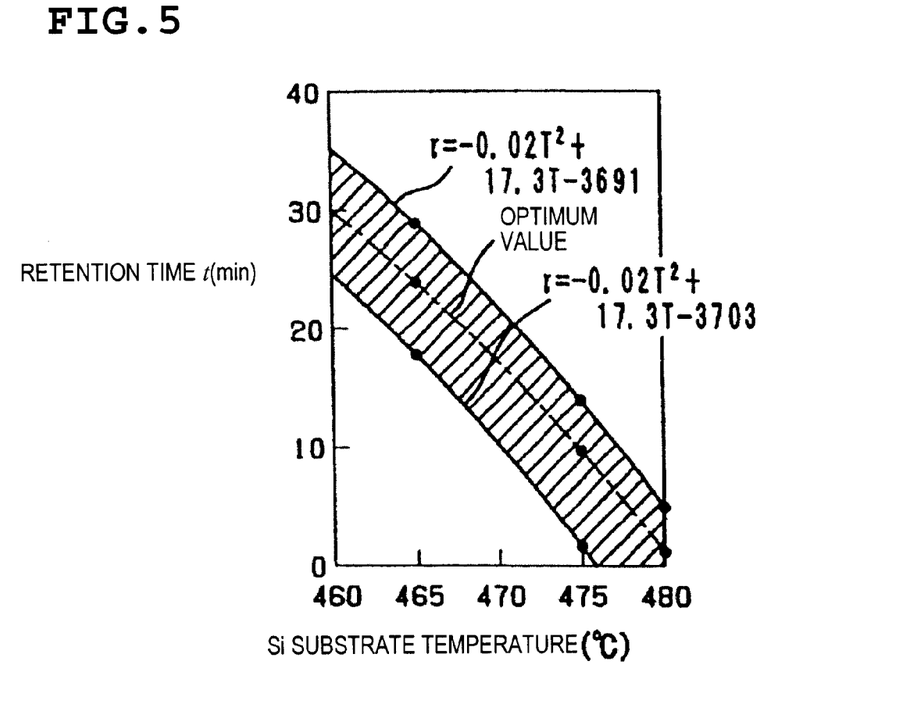
FIG. 5 is a graph showing the relationship between the Si substrate temperature and the retention time.

In addition, after the temperature of the Si single crystal substrate 11 is raised to each of 465° C., 475° C., and 480° C., retention times are provided at each of the substrate temperatures prior to the start of the formation of the main growth layer, and the relationship among the substrate temperature, the retention time, and the carrier mobility is examined. As is clear from FIG. 4, the carrier mobility varied with the retention time at every temperature, and there were optimum retention times. Regarding each of the cases in which the temperature were 465° C., 475° C., and 480° C., and the carrier mobility exceeded 45,000 $cm^2/V \cdot s$, when the relationships between the temperature T (° C.) and the retention time $\tau$ (min) were plotted, those could be approximated by a quadratic function as shown in FIG. 5. That is, the relationships between the temperature T (° C.) and the retention time $\tau$ (min), in order to obtain a carrier mobility exceeding 45,000 $cm^2/V \cdot s$, is approximated, using the least-squares method, by the following formula (1):

$$-0.02T^2+17.3T-3703 < \tau < -0.02T^2+17.3T-3691 \quad \text{Formula (1)}$$

wherein T is between 460° C. and 480° C.

As described above, it is indicated that there is an optimum substrate temperature and an optimum retention time for bringing out crystallization of InSb having a stoichiometric composition by a heat treatment of In and Sb, supplied on the Si single crystal substrate 11 during the formation of the initial seed layer, in the step of forming the main growth layer.

Figure 6:
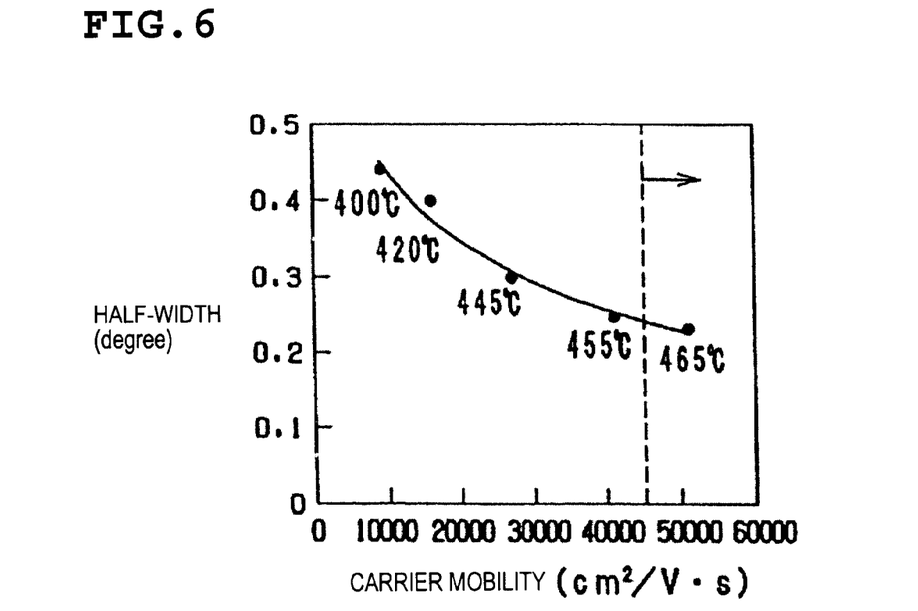
FIG. 6 is a graph showing the relationship between the carrier mobility at each Si substrate temperature and the half-width.

Regarding the step of forming the main growth layer, the half-widths of the rocking curves based on the X-ray diffraction (XRD) of the InSb thin films and the evaluation results of the carrier mobility, in the case in which the formations were performed after the optimum retention times relative to various substrate temperatures determined from the aforementioned formula (1), are shown in FIG. 6. The half-width decreases and the carrier mobility increases with increasing of the substrate temperature. That is, it was made clear that the optimization of the annealing effect determined from the substrate temperature and the retention time contributes to improve the orientation property of the crystal of the InSb thin film and to improve the carrier mobility.

Therefore, as shown in FIG. 2, when the initial seed layer having a predetermined film thickness is formed, the vapor deposition is suspended, and the temperature of the Si single crystal substrate 11 is raised to 460° C. to 480° C. After the temperature of the Si single crystal substrate 11 is raised to 460° C. to 480° C., the retention time τ (min) approximated by the function of the temperature T (° C.) of the Si single crystal substrate 11 is provided. More specifically, the retention time τ (min) satisfying the aforementioned formula (1) is provided as is indicated by C in FIG. 2, which is a step of retaining.

After the Si single crystal substrate 11 has been retained for retention time τ (min), the formation of the main growth layer made of Sb by the boat heating type vacuum evaporation method and In by the electron beam heating type vacuum evaporation method is started. The growth velocity of the main growth layer is low, in the range of 0.01 to 0.5 nm/s, immediately after the start as is indicated by D in FIG. 2, which is a step of forming the main growth layer at a low velocity. When the film thickness of the main growth layer reaches 5 to 100 nm, the growth velocity is switched to a high velocity growth rate, in the range of 0.2 to 5 nm/s, and the InSb main growth layer is formed until the film thickness finally reaches about 2 to 4 mm as is indicated by E in FIG. 2, which is a step of forming the main growth layer at a high velocity. In the formation of the main growth layer, the supply ratio of Sb relative to In, that is, Sb/In, is 1.4 to 4.0.

As described above, regarding the step of forming the main growth layer, since the supply velocities of In and Sb in the initial stage of the start are controlled to be at a low level, in the lattice misfit transition region with Si in which inversions are likely to concentrate, In atoms and Sb atoms are allowed time to locate at stable lattice positions by surface diffusion. Accompanying this, the crystallization property of InSb is improved and the carrier mobility is further increased. Thereafter, the thickness of the InSb main growth layer is increased, and when the growth reaches a pure InSb orientation growth region in which the influence of the Si crystal lattice is decreased, the crystallization property is not degraded with increase in the supply velocity of In and Sb.

The resulting InSb thin film was evaluated using a reflection high-energy electron diffraction (RHEED), an X-ray diffraction (XRD), and an inductively coupled plasma-atomic emission spectroscopy (ICP-AES). As a result, it was made clear that the initial seed layer before the start of the main growth layer and the main growth layer were epitaxially grown InSb(111) having a stoichiometric composition on Si(111). The carrier mobility was measured using a Van der Pauw's method with the result that the carrier mobility was high, e.g., 45,000 $cm^2/V \cdot s$ to 52,000 $cm^2/V \cdot s$.

Regarding the present embodiment, in the formation of the In buffer layer, the InSb initial seed layer, and the InSb main growth layer, In is vacuum evaporated using the electron beam heating method (EB method). In the case in which the low melting point material, In, is vapor deposited, in general, the resistance heating type vacuum evaporation method is used. In the present embodiment, however, since the control of the vapor deposition velocity is important, the EB method is adopted, in which finer power control is possible regarding the source of the vapor deposition. Consequently, while variations in the vapor deposition velocity of the conventional resistance heating type are ±0.1 nm/s, regarding the present embodiment, the velocity can be controlled with variations of ±0.01 nm/s or less, the thin film can be formed at a low velocity of the order of 0.01 nm/s, and the film thickness can be controlled with high precision of the order of 0.1 nm, so that the semiconductor thin film having excellent quality can be formed.

In the aforementioned embodiment, regarding the HF termination treatment of the Si single crystal substrate 11, the Si single crystal substrate 11 was immersed in the 5% aqueous solution of hydrogen fluoride at a standstill for 1 minute, although it is preferable to immerse the Si single crystal substrate 11 in the 5% aqueous solution of hydrogen fluoride while continuously shaking for 1 minute. Statistical values, in the lot of formed films, of the carrier mobility of each of the InSb thin film formed on the Si single crystal substrate 11 treated at a standstill and the InSb thin film formed on the Si single crystal substrate 11 treated while shaking are shown in Table 1. Average values of the carrier mobility of both thin films are equivalent to each other, although variations, that is, 3× standard deviation/average value, in the treatment while shaking is decreased by about 60% compared to that in the treatment while still standing. When the Si single crystal substrate 11 is shaken in the aqueous solution of hydrogen fluoride, the surface of the Si single crystal substrate 11 can be continuously exposed to the aqueous solution of hydrogen fluoride in a fresh and activated state, so that stable HF termination can be performed on all over the Si single crystal substrate 11, and variations in the electrical properties, such as the carrier mobility and the resistivity, can be decreased.

TABLE 1

|  | Treatment While At A Standstill | Treatment While Shaking |
|---|---|---|
| Average Value ($cm^2/V \cdot s$) | $4.86 \times 10^4$ | $4.90 \times 10^4$ |
| Standard Deviation ($cm^2/V \cdot s$) | $0.25 \times 10^4$ | $0.10 \times 10^4$ |
| 3 × Standard Deviation/Average Value (%) | 15.31 | 6.01 |

Furthermore, while the Si single crystal substrate 11 is at a standstill, the surface of the Si single crystal substrate 11 can be continuously exposed to the aqueous solution of hydrogen fluoride in a fresh and activated state by the step of:

(1) blowing $N_2$, etc., through the bath of the aqueous solution of hydrogen fluoride so as to bubble and agitate;
(2) jetting the aqueous solution of hydrogen fluoride from a nozzle, etc.; or
(3) agitating the aqueous solution of hydrogen fluoride using an agitation vane, etc., so that the effects similar to those in above description can be produced.

Figure 7:
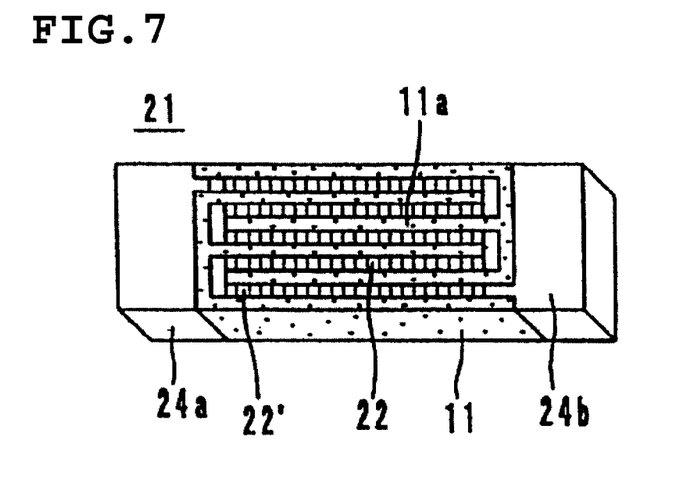
FIG. 7 is a perspective view of a magnetoelectric conversion element according to an embodiment of the present invention.

A magnetic resistance element 21 as shown in FIG. 7, which is one of the magnetoelectric conversion elements, was formed as follows. The InSb thin film formed on the Si single crystal substrate 11 was subjected to photolithography and etching so as to form a magnetic resistance pattern, and furthermore, a short circuit electrode and terminal electrodes, composed of Ni, Ti, Cr, Cu, Ge, Au, Al, etc., or an alloy thereof, or a multi-layer film, were formed by photolithography, and etching or lift-off. A meandrous magnetic resistance pattern 22 for producing a predetermined magnetic resistance, a short circuit electrode 22', and a protection film, although not shown in the drawing, are formed on the upper face 11a (hereafter referred to as detection face 11a) of the Si single crystal substrate 11. Terminal electrodes 24a and 24b are formed at both ends of the substrate 11. Regarding this magnetic resistance element 21, even when the temperature cycle from −50° C. to +150° C. is repeated, problems of adhesion defect between the materials, peeling, and degradation in properties are not generated, so that sufficient durability in high temperature uses can be exhibited.

Figure 8:
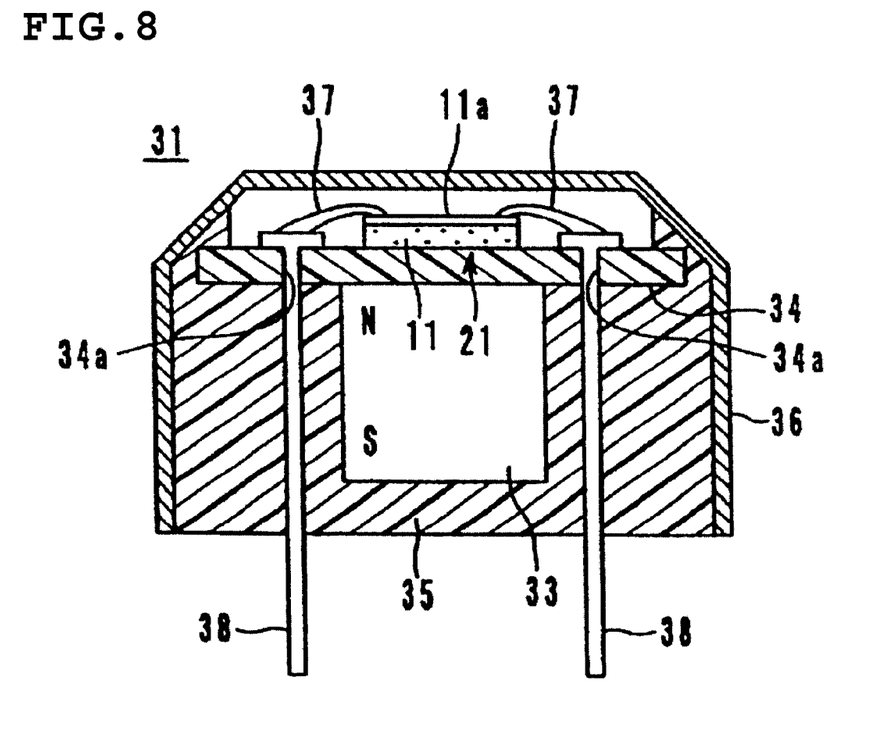
FIG. 8 is a sectional view of a magnetic sensor using the magnetoelectric conversion element as shown in FIG. 7.

FIG. 8 is a structural sectional view of a magnetic sensor 31 provided with the aforementioned magnetic resistance element 21. The magnetic sensor 31 is composed of the magnetic resistance element 21, a magnet 33 for applying a bias magnetic field to the magnetic resistance element 21, a circuit substrate 34 which is a support member for mounting the components 21 and 33, and a non-magnetic protection case 36.

The magnetic resistance element 21 is mounted in a horizontal position on the circuit substrate 34 with an adhesive, etc. On the other hand, terminals 38 are inserted through penetration holes 34a provided in the circuit substrate 34. The top parts of the terminals 38 and the terminal electrodes 24a and 24b of the magnetic resistance element 21 are connected with lead frames 37. These may be electrically connected via circuit patterns, although not shown in the drawing, provided on the circuit substrate 34.

The magnet 33 is fastened using an adhesive to the face on the opposite side of the face, on which the magnetic resistance element 21 is mounted, of the circuit substrate 34. The magnet 33 faces the magnetic resistance element 21 with the circuit substrate 34 therebetween. The circuit substrate 34 mounted with the components 21, 33, and 38 are contained in the non-magnetic protection case 36 together with a filler 35.

Figure 9:
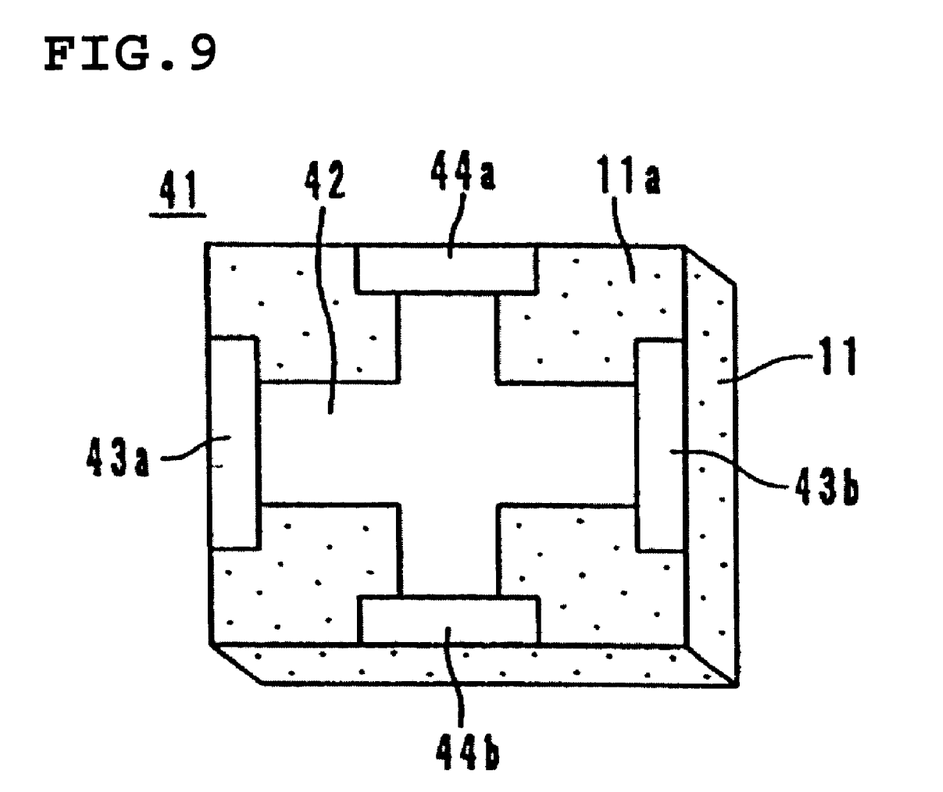
FIG. 9 is a perspective view of a magnetoelectric conversion element, such as a hall effect device, according to another embodiment of the present invention.

A hall-effect device 41, as shown in FIG. 9, which is one of the magnetoelectric conversion elements, was formed as follows. The InSb thin film formed on the Si single crystal substrate 11 was subjected to photolithography and etching so as to form a hall-effect element pattern, and furthermore, terminal electrodes, composed of Ni, Ti, Cr, Cu, Ge, Au, Al, etc., or an alloy thereof, or a multi-layer film, are formed by photolithography, and etching or lift-off. The hall-effect element pattern 42 in the shape of a cross and a protection film, although not shown in the drawing, are formed on the detection face 11a of the Si single crystal substrate 11. Terminal electrodes 43a, 43b, 44a, and 44b are formed on the four side faces of the substrate 11. Regarding this hall-effect device 41, even when the temperature cycle from −50° C. to +150° C. is repeated, problems of adhesion defect between the materials, peeling, and degradation in properties are not generated, so that sufficient durability in high temperature uses can be exhibited.

The method for manufacturing the semiconductor thin film, and the magnetoelectric conversion element provided with the semiconductor thin film manufactured by the aforementioned method according to the present invention are not limited to the aforementioned embodiments. The present invention covers various modifications within the scope of the invention. For example, in the aforementioned embodiments, a (111) substrate was used as the Si single crystal substrate, although substrates of (100) and other orientation, and graded substrates may be used. When the surface is the Si single crystal film as the SOI (silicon on insulator) structure substrate formed by a lamination method or an ion injection method, a semiconductor thin film having excellent quality similar to those can be produced. In particular, in the case in which the substrate has an SOI structure, since the leakage current to the substrate can be minimized by decreasing the layer thickness of the Si crystal, which is the semiconductor, the sensitivity properties are excellent in the application for the magnetoelectric conversion element, etc.

In the aforementioned embodiments, the In buffer layer, the InSb initial seed layer, and the InSb main growth layer were formed by the vacuum evaporation method, although semiconductor thin films having excellent quality can be produced by using an appropriate ion or plasma, for example, by a PAD method (Plasma Assisted Deposition method) and ICB method (Ion Cluster Beam method). Regarding the vacuum evaporation of In, the resistance heating type vacuum evaporation method may be used instead of the EB method.

As is clear from the above description, according to the present invention, by forming the main growth layer made of indium and antimony while the temperature of the substrate having the surface made of a silicon single crystal is kept at 460° C. to 480° C., the semiconductor thin film having high carrier mobility of 45,000 cm² V·s or more can be produced. As a consequence, the InSb thin film having the carrier mobility equivalent to that of the conventional InSb single crystal bulk flake can be directly formed without interposition of the adhesive layer, so that superior semiconductor magnetoelectric conversion element having sufficiently satisfactory reliability in the use at the temperature range of −50° C. to +150° C. can be produced.

Furthermore, in the formation of the main growth layer, the temperature of the substrate having a surface made of the silicon single crystal is raised to 460° C. to 480° C., and subsequently, the main growth layer is formed after the retention time approximated by the function of the temperature of the aforementioned substrate is provided, so that the semiconductor thin film having high carrier mobility can be further stably produced.

The main growth layer is initially formed at a relatively low growth velocity so as to have a predetermined layer thickness, and successively, the main growth layer is formed at a relatively high growth velocity, so that the semiconductor thin film having high carrier mobility can be efficiently produced.

The surface oxide film is removed from the substrate having the surface made of the silicon single crystal and hydrogen termination of the surface of the substrate are performed with the treatment using aqueous solutions, such as an aqueous solution of hydrogen fluoride, while the surface of the substrate is continuously exposed to the aqueous solution in the activated state, so that the semiconductor thin film having decreased variations in the electrical properties and having stable quality can be formed.

Furthermore, when In is vacuum evaporated using the electron beam heating method, the thin film can be formed at a low velocity of the order of 0.01 nm/s, and the film thickness can be controlled with high precision of the order of 0.1 nm, so that the semiconductor thin film having an excellent quality can be formed.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for manufacturing a semiconductor thin film, comprising the steps of:
    (a) removing a surface oxide film from a substrate having a surface comprising a silicon single crystal;
    (b) hydrogen terminating the surface of said substrate;
    (c) forming a buffer layer comprising indium on said substrate;
    (d) forming an initial seed layer comprising indium and antimony on said buffer layer; and
    (e) forming a main growth layer comprising indium and antimony on said initial seed layer while a temperature of said substrate is kept at 465° C. to 475° C.

2. A method for manufacturing a semiconductor thin film according to claim 1, wherein steps (a) and (b) are performed using an aqueous solution selected from the group consisting of an aqueous solution of hydrogen fluoride, an aqueous solution of ammonium fluoride, and a mixed aqueous solution thereof.

3. A method for manufacturing a semiconductor thin film according to claim 1 or claim 2, wherein in step (e), said main growth layer is formed after a retention time approximated by a predetermined function of the temperature of said substrate.

4. A method for manufacturing a semiconductor thin film according to claim 3, wherein in step (e), said temperature T (° C.) and said retention time $\tau$ (min) satisfy the relationship represented by the formula $$-0.02T^2+17.3T-3703<\tau<-0.02T^2+17.3T-3691.$$

5. A method for manufacturing a semiconductor thin film according to claim 4, wherein the indium of said buffer layer, said initial seed layer, and said main growth layer formed by heating and vaporizing indium by an electron beam heating type vacuum evaporation method.

6. A method for manufacturing a semiconductor thin film according to claim 3, wherein the indium of said buffer layer, said initial seed layer, and said main growth layer is formed by heating and vaporizing indium by an electron beam heating type vacuum evaporation method.

7. A method for manufacturing a semiconductor thin film, comprising the steps of:
    (a) removing a surface oxide film from a substrate having a surface comprising a silicon single crystal;
    (b) hydrogen terminating the surface of said substrate;
    (c) forming a buffer layer comprising indium on said substrate;
    (d) forming an initial seed layer comprising indium and antimony on said buffer layer; and
    (e) forming a main growth layer comprising indium and antimony on said initial seed layer; wherein
    steps (a) and (b) are performed using an aqueous solution selected from the group consisting of an aqueous solution of hydrogen fluoride, an aqueous solution of ammonium fluoride, and a mixed aqueous solution thereof while the surface of said substrate is continuously exposed to said aqueous solution in an activated state; and
    the activated state includes at least one of blowing $N_2$ in said aqueous solution, jetting said aqueous solution and agitating said aqueous solution.

8. A method for manufacturing a semiconductor thin film according to any one of claims 1, 2, or 7, wherein the indium of said buffer layer, said initial seed layer, and said main growth layer is formed by heating and vaporizing indium by an electron beam heating type vacuum evaporation method.

* * * * *